(12) United States Patent
Kurita et al.

(10) Patent No.: US 7,898,347 B2
(45) Date of Patent: Mar. 1, 2011

(54) DIELECTRIC RESONATOR OSCILLATOR AND RADAR SYSTEM USING THE SAME

(75) Inventors: Naoyuki Kurita, Kokubunji (JP); Kazuo Matsuura, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/125,917

(22) Filed: May 23, 2008

(65) Prior Publication Data
US 2009/0051449 A1    Feb. 26, 2009

(30) Foreign Application Priority Data
Jun. 18, 2007    (JP)    ................ 2007-160139

(51) Int. Cl.
H03B 5/18    (2006.01)
(52) U.S. Cl. .............. 331/107 SL; 331/107 DP; 331/117 D
(58) Field of Classification Search ........... 331/107 SL, 331/107 DP, 117 D
See application file for complete search history.

(56) References Cited
U.S. PATENT DOCUMENTS
5,291,153 A    3/1994    Shiga

2003/0048217 A1    3/2003    Kurita et al.
2007/0057738 A1*   3/2007    Baba et al. .................... 331/34

FOREIGN PATENT DOCUMENTS
JP    4-326607 A    11/1992
JP    8-293728 A    11/1996
JP    11-205039 A    7/1999
JP    2003-84058 A    3/2003

* cited by examiner

*Primary Examiner*—Robert Pascal
*Assistant Examiner*—James E Goodley
(74) *Attorney, Agent, or Firm*—Miles & Stockbridge P.C.

(57) ABSTRACT

In the mass production of dielectric resonator oscillators (DROs), it is necessary to regulate the position where a dielectric resonator is placed with a high degree of accuracy and thus time required for the assembly work increases undesirably. Further, a terminating resistor and earthing means are formed at an end of a transmission line that is electromagnetically coupled to the dielectric resonator and constitutes the resonator on a dielectric substrate, and as a result the production cost increases. The present invention is characterized in that, in the components of a DOR, only a transmission line is formed on a dielectric substrate, and an oscillating active element and a terminating resistor and the earthing means on an MMIC chip are connected to the transmission line with metallic wires, metallic ribbons, or the like. Further, an open stub is formed in the middle of the transmission line on the side close to the oscillating active element when it is viewed from the dielectric resonator.

16 Claims, 9 Drawing Sheets

DIELECTRIC RESONATOR OSCILLATOR AND RADAR SYSTEM USING THE SAME

CLAIM OF PRIORITY

The present application claims priority from Japanese application JP 2007-160139 filed on Jun. 18, 2007, the content of which is hereby incorporated by reference into this application.

FIELD OF THE INVENTION

The present invention relates to a dielectric resonator oscillator used in a radar system or a communication system using a microwave or a millimeter wave, and a radar system or a communication system that uses the dielectric resonator oscillator.

BACKGROUND OF THE INVENTION

As a dielectric resonator oscillator (DRO) used in a radar system or a communication system using a microwave or a millimeter wave, a device disclosed in U.S. 2003/0048217 A1 (Japanese Patent Application Laid-Open Publication No. 2003-84058) is known for example. FIG. 11 shows a first example of the DRO disclosed in the document. A dielectric substrate 25 is disposed adjacently to an MMIC (Microwave Monolithic IC) chip 2, and a transmission line 8 and a terminating resistor and earthing means 9 are formed on the dielectric substrate 25. The MMIC chip 2 is electrically connected to the dielectric substrate 25 with wires 14. By disposing a columnar dielectric resonator 1 close to the transmission line 8 on the dielectric substrate 25, the transmission line 8 is electromagnetically coupled to the dielectric resonator 1 and they are operated as a resonator. Further, a varactor diode 5 to regulate an oscillating frequency by voltage applied from a terminal 11 is connected to a line in the MMIC chip 2 connected to the transmission line 8. A similar configuration is disclosed also in U.S. Pat. No. 5,291,153 (Japanese Patent Application Laid-Open Publication No. H04-326607).

FIG. 12 shows a second example of the DRO disclosed in U.S. 2003/0048217 A1. A transmission line 8 and a terminating resistor and earthing means 9 constituting a resonator are formed on an MMIC chip 2. A dielectric resonator 1 is disposed on the MMIC chip 2 close to the transmission line 8 or on a dielectric substrate 25 disposed outside, and the transmission line 8 is electromagnetically coupled to the dielectric resonator 1 to form a resonator.

Meanwhile, Japanese Patent Application Laid-Open Publication No. H11-205039 discloses a microwave oscillator having a transmitting circuit formed by connecting a dielectric resonator to an end of a microstrip line and coupling the other end thereof to an active element through a capacitor, wherein a stub is formed at an end of the microstrip line, the length of the stub is set at an appropriate length, and an oscillating frequency is regulated.

Further, Japanese Patent Application Laid-Open Publication No. H08-293728 discloses an MMIC voltage controlled oscillator wherein a tuning circuit is incorporated into the interior of an MMIC, and a microstrip resonant line constituting a resonator or only a dielectric resonator is formed on the external circuit of the MMIC.

SUMMARY OF THE INVENTION

In a dielectric resonator oscillator used in a radar system or a communication system using a microwave or a millimeter wave, methods for improving a mass-production yield and reducing the production cost are strongly desired.

In the case of the DRO shown in FIG. 11, it is necessary to use not only the MMIC chip 2 but also the dielectric substrate 25 and to form circuit parts such as the transmission line 8 and the terminating resistor and earthing means 9 on the dielectric substrate, and thus the problem here is that the production cost increases.

In the case of the DRO shown in FIG. 12 in contrast, it is not necessary to form circuit components such as the transmission line 8 and the terminating resistor and earthing means 9 on the dielectric substrate 25 and it is possible to realize low cost production. However the relative permittivity of the MMIC chip 2 comprising a semiconductor of GaAs, Si, or the like is as high as 10 or more. As a result, the coupling between the transmission line 8 and the dielectric resonator 1 is weak in comparison with the configuration shown in FIG. 11 and the performance of the oscillator deteriorates. Further, the transmission line 8 must be separated from other circuit parts formed on the MMIC chip 2 at a certain distance or more in order to avoid unnecessary electromagnetic coupling between them. The resultant problems are that the area of the MMIC chip 2 increases and the production cost also increases.

In addition, when the DROs having the configuration disclosed in FIG. 11 or 12 are produced in large quantities, it is necessary to regulate the place where a dielectric resonator 1 is disposed with a very high degree of accuracy while the variations of the size of the dielectric resonator 1 and the performance of the MMIC chip 2 are taken into consideration. A resultant problem is that the time required for the assembly work increases.

Afore mentioned Japanese Patent Application Laid-Open Publication No. H11-205039 describes that, in a dielectric resonator, the oscillating frequency increases when the tip of a stub is cut and the length L is shortened, and the oscillating frequency decreases when solder is applied to the stub and thereby it is possible to regulate an oscillating frequency without the cutting of the dielectric resonator. However, the document does not disclose a configuration of forming a DRO by mounting a dielectric resonator on a dielectric substrate.

Furthermore, afore mentioned Japanese Patent Application Publication No. H08-293728 intends to reduce the cost by incorporating a tuning circuit into the interior of an MMIC and forming only a connecting line on a dielectric substrate. However, the document does not disclose a configuration of forming a DRO by mounting a dielectric resonator on a dielectric substrate.

An object of the present invention is to provide a dielectric resonator oscillator that can improve a mass-production yield and reduce the production cost, and a radar system using the dielectric resonator oscillator.

A typical example of the present invention is as follows. That is, a dielectric resonator oscillator comprising an MMIC; a transmission line; and a dielectric resonator disposed on a dielectric substrate, wherein the MMIC comprises an oscillating circuit; a frequency regulation circuit; and a power supply circuit, wherein an active element on the MMIC is connected to the transmission line with metallic wires or metallic ribbons, wherein the dielectric resonator is electromagnetically coupled to the transmission line, and wherein the dielectric resonator oscillator further comprises a member for oscillating frequency regulation formed on the dielectric substrate.

According to the preset invention, it is possible to provide a dielectric resonator oscillator and a radar system using the

DETAILED DESCRIPTION OF THE PREFERRED EMBODIMENTS

In the case of a DRO according to a typical embodiment of the present invention, in the components thereof, only a transmission line is formed on a dielectric substrate having a lower relative permittivity than that of an MMIC, and an oscillating active element and a terminating resistor and earthing means on the MMIC chip are connected to the transmission line with metallic wires, metallic ribbons, or the like. Further, an open stub is formed in the transmission line on the side close to the oscillating active element when it is viewed from the dielectric resonator.

In the components of a DRO according to the present invention, the component that is formed on a dielectric substrate is only a transmission line and it is not necessary to form components such as a terminating resistor and earthing means unlike a conventional case. As a result, the production cost can be reduced. Further, since a transmission line is electromagnetically coupled to a dielectric resonator on a dielectric substrate having a low relative permittivity, the coupling of them is never weakened and the performance of an oscillator is prevented from deteriorating unlike a conventional case. Furthermore, since the oscillating frequency of the DRO can be regulated by adjusting the length of an open stub formed in a transmission line, it is not necessary to regulate the position of a dielectric resonator and the time required for assembly in mass production is reduced considerably.

Preferable embodiments according to the present invention are hereunder explained in reference to drawings.

First Embodiment

Figure 1:
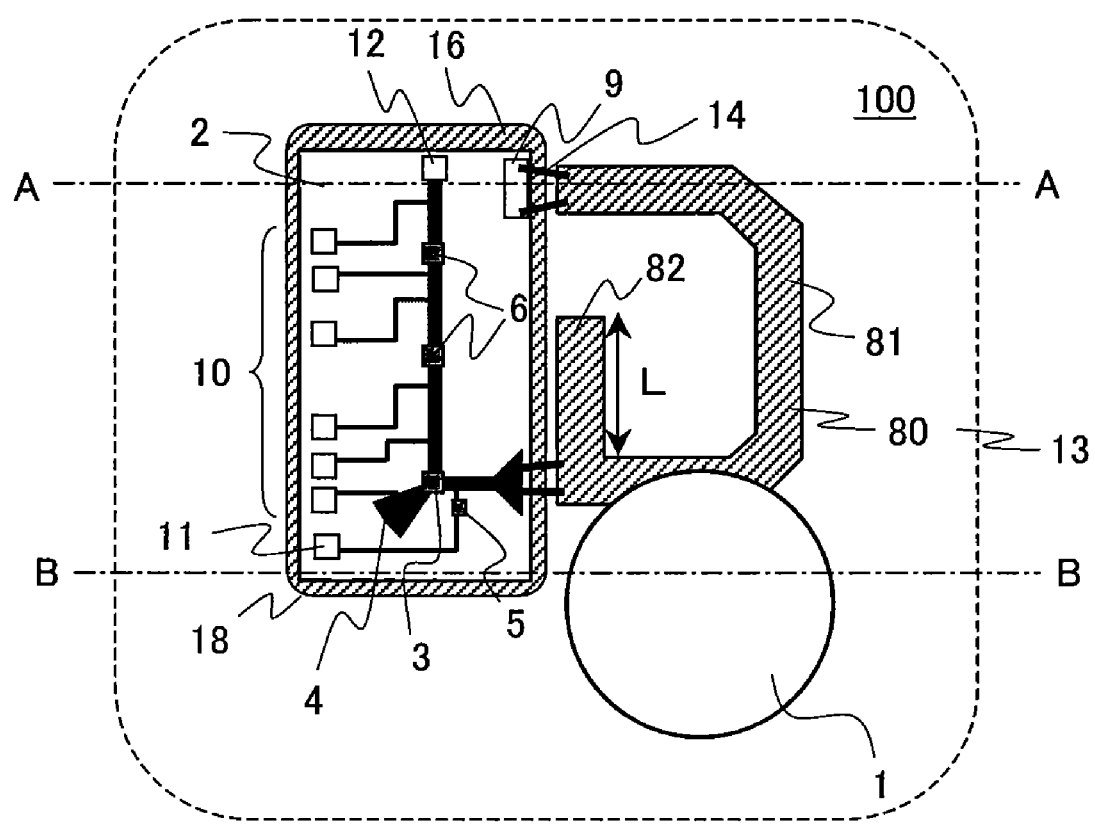
FIG. 1 is a top view showing a dielectric resonator oscillator according to a first embodiment of the present invention.
Figure 2A:
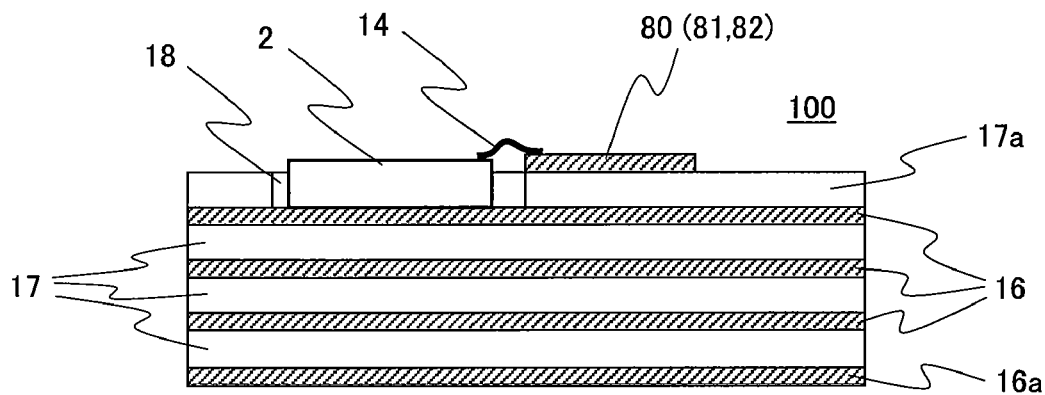
FIG. 2A is a sectional view taken on line A-A in FIG. 1.
Figure 2B:
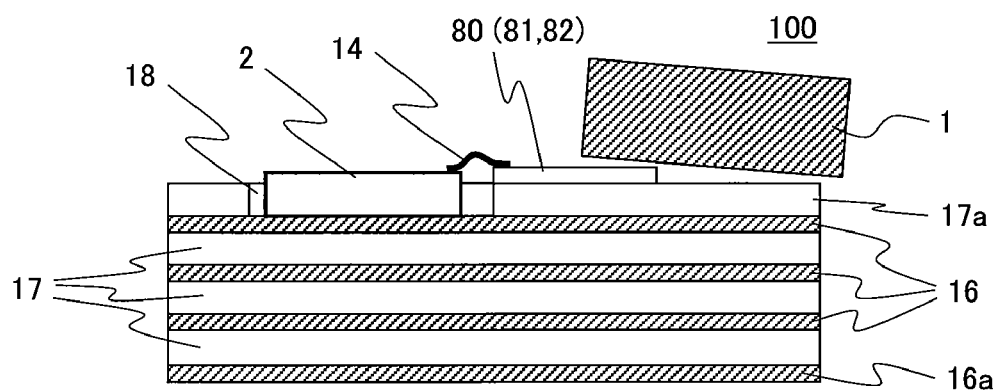
FIG. 2B is a sectional view taken on line B-B in FIG. 1.
Figure 2C:
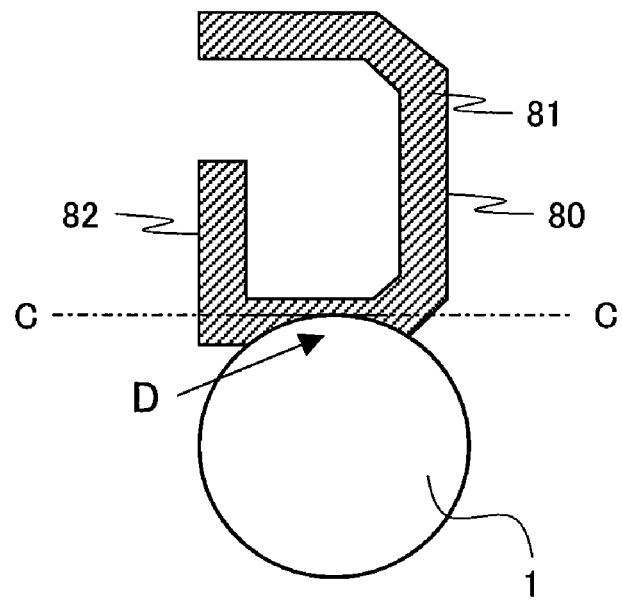
FIG. 2C is a view showing the positional relation between a dielectric resonator and a transmission line according to the first embodiment.
Figure 2D:
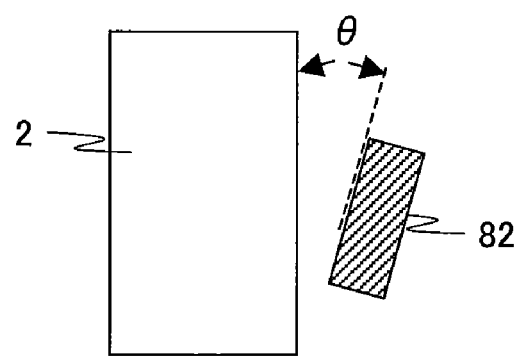
FIG. 2D is a view showing a modified example of an open stub according to the first embodiment.

The first embodiment according to the present invention is explained in reference to FIGS. 1, 2A to 2D, and FIGS. 3A and 3B. FIG. 1 is a top view showing a dielectric resonator oscillator according to the first embodiment of the present invention. FIG. 2A is a sectional view taken on line A-A in FIG. 1. FIG. 2B is a sectional view taken on line B-B in FIG. 1. FIG. 2C is a view explaining the configuration of the first embodiment. FIG. 2D is a view explaining a modified example of the first embodiment.

In a dielectric resonator oscillator 100 according to the present embodiment, a dielectric resonator 1, an MMIC 2, and a transmission line 81 are formed on a common dielectric substrate 13. That is, on a multilayered dielectric substrate 13, a layered structure comprising a bottom conductive layer 16a, inner conductive layers 16, inner dielectric layers 17, and a top dielectric layer 17a, a columnar dielectric resonator 1, and an MMIC chip 2 are disposed. The multilayered dielectric substrate 13 is made of LTCC (Low Temperature Co-fired Ceramics). The dielectric layers 17 and the top dielectric layer 17a (referred to as dielectric layers unless otherwise specified) are made of a material of a low permittivity, such as alumina ($Al_2O_3$). Here, the multilayered structure comprising the inner conductive layers 16 and the dielectric layers 17 has various functions including a power supply circuit and a bias circuit, and such a multilayered structure is not a constituent element essential to the present embodiment.

As shown in FIG. 2A, the MMIC chip 2 is incorporated into a hole 18 pierced in the top dielectric layer 17a that is the uppermost layer on the multilayered dielectric substrate 13 and bonded and fixed to an inner conductive layer 16 exposed at the bottom of the hole 18.

The MMIC chip 2 contains an oscillating circuit, a frequency regulation circuit, a power supply circuit, and other peripheral circuits. That is, on the MMIC chip 2, an active element 3 to activate oscillation, a negative resistance producing element 4, active elements for buffer amplification 6 to amplify oscillating electricity, peripheral circuits such as a power supply circuit, a terminating resistor and earthing means 9, power source terminals 10, a frequency regulating terminal 11, and an output terminal 12 are formed. Further, a varactor diode 5 to adjust an oscillating frequency by a voltage applied through the frequency regulating terminal 11 is connected to the line in the MMIC chip 2.

Further, on the top dielectric layer 17a, a transmission line 81 and an open stub 82 having the length L as a member for oscillating frequency regulation are formed adjacently to the MMIC chip 2 with a strip-shaped top conductive layer 80 having a substantially constant width. In the present embodiment, the strip-shaped top conductive layer 80 is bent on the top dielectric layer 17a and the reason is to fit the strip-shaped top conductive layer 80 to the size of the MMIC chip 2. The transmission line 81 formed with the top conductive layer is connected to the surface of the MMIC chip 2 on substantially an identical plane and at adjacent positions with metallic wires or metallic ribbons in order to minimize losses. That is, the oscillating active element 3 on the MMIC chip 2 is electrically connected to the transmission line 81 with metallic wires 14 and the terminating resistor and the earthing means 9 are also electrically connected to the transmission line 81 with metallic wires 14.

Further, as shown in FIG. 2B, the columnar dielectric resonator 1 is fixed onto the top dielectric layer 17a with an adhesive agent or the like so that a part of the bottom face of the columnar dielectric resonator 1 may cover the transmission line 81.

The columnar dielectric resonator 1 is electromagnetically coupled to the transmission line 81 by being allocated on the dielectric layer close to the transmission line 81, and thus is operated as a resonator. To take an instance, the dielectric resonator 1 is a column 1.4 mm in diameter and 0.5 mm in height and the width of the transmission line 81 is 300 μm. Then they are allocated so that the outer periphery of the dielectric resonator 1 may overlap with the transmission line 81 in the width range of 200 to 300 μm.

In this way, the dielectric resonator 1 is disposed on the top dielectric layer 17a in the vicinity of the transmission line 81 or in the state of overlapping with the transmission line, the oscillation condition is settled by electromagnetically coupling the dielectric resonator 1 to the transmission line 81 at a desired resonance frequency that is unambiguously determined by the base area, the height, and the permittivity of the material, and thereby the oscillation operation of the oscillator circuit is activated. The terminating means and the earthing means 9 are formed at the other end of the transmission line 81 and thereby electromagnetic fields having frequencies other than the resonance frequency are prevented from causing unnecessary reflection and destabilizing the operation of the circuit.

Circuit element parameters in the MMIC chip 2 are adjusted so that negative resistance may appear in a desired frequency band with the oscillating active element 3 and the negative resistance producing element 4 connected to the oscillating active element 3.

Here, the open stub 82 is formed opposite the dielectric resonator 1 in the manner of interposing the transmission line 81 in between so as not to overlap with the dielectric resonator 1. That is, as shown in FIG. 2C, the open stub 82 is formed inside the top conductive layer 80, in other words on the side opposite the side (represented by D), of the line segment C-C, where the dielectric resonator 1 overlaps with the transmission line 81, and the dielectric resonator 1 is placed outside.

In the present embodiment, the dielectric resonator oscillator 100 is configured so that the open stub 82 may be disposed in the transmission line 81 on the dielectric substrate in the middle on the side close to the active element in the MMIC chip 2 when it is viewed from the dielectric resonator 1 and the oscillating frequency of the dielectric resonator oscillator 100 may be regulated by adjusting the length of the stub.

Here, although the strip-shaped top conductive layer 80 is drawn with straight lines in FIG. 1, the actual shape has moderately curved corners. Further, a D-shape is adopted in a plan view but the shape is not limited to such a shape. For example, when the open stub 82 is configured so as to form an angle of θ with the MMIC chip 2 and open toward the end thereof as shown in FIG. 2D, the distance between the MMIC chip 2 and the end of the open stub 82 increases and the adjustment (trimming) of the stub length is facilitated.

In the present embodiment, in the components of the DRO 100, only the top conductive layer 80 constituting the transmission line 81 and the open stub 82 is formed on the dielectric substrate, and the oscillating active element and the terminating resistor and the earthing means on the MMIC chip are connected to the transmission line with metallic wires, metallic ribbons, or the like. Further, the open stub is formed in the middle of the transmission line on the side close to the oscillating active element when it is viewed from the dielectric resonator. As a result, it is not necessary to install the terminating resistor and the earthing means, a through hole, and others on the dielectric substrate and it is possible to reduce the production cost. Further, it is possible to regulate the oscillating frequency of the DRO by cutting the open stub to an arbitrary length and hence it is possible to avoid a process of precisely adjusting the positioning of the dielectric resonator and remarkably reduce the assembly time. To take an instance, the time required for assembly work can be reduced to one several tenth the conventional case.

Further, since the transmission line is electromagnetically coupled to the dielectric resonator on the dielectric substrate having a lower relative permittivity than the MMIC, the effects of never weakening the coupling of them and preventing the performance of the oscillator from deteriorating are obtained unlike a conventional case.

Figure 3A:
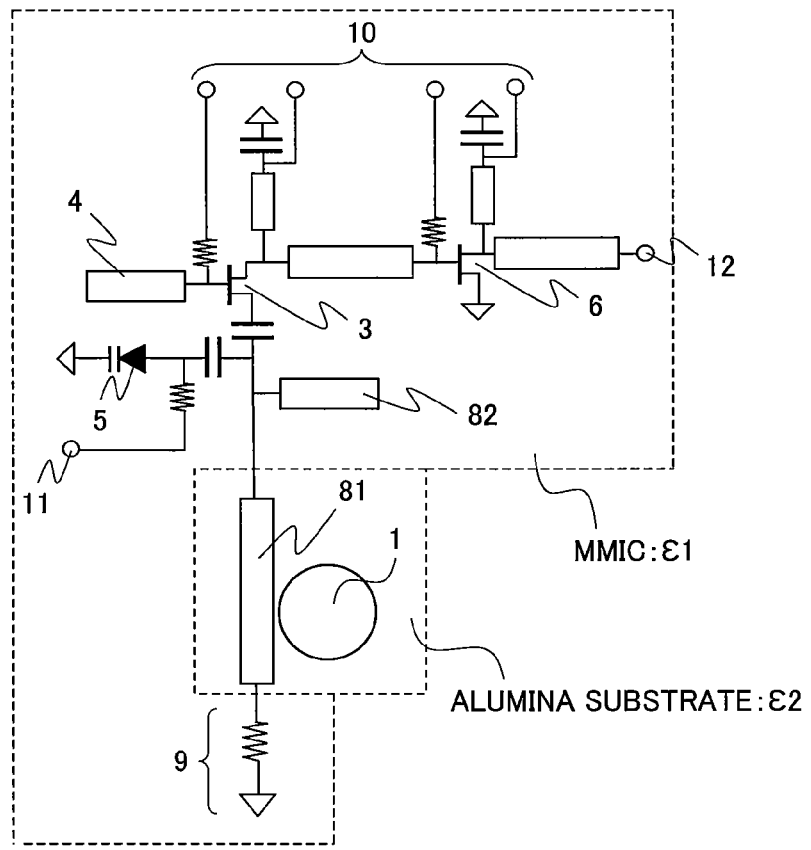
FIG. 3A is an equivalent circuit schematic according to the first embodiment.
Figure 3B:
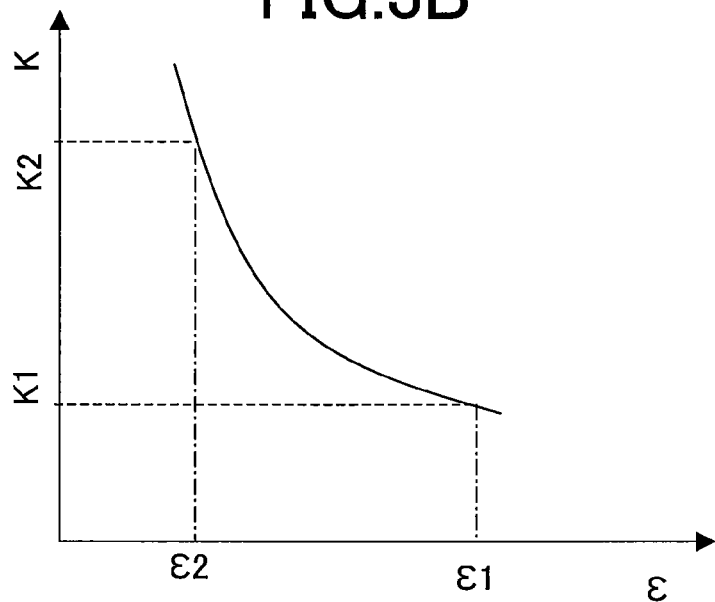
FIG. 3B is a graph showing the relationship between a permittivity and an electromagnetic coupling constant of a dielectric substrate according to the first embodiment.

This will be explained in reference to FIGS. 3A and 3B. Firstly, FIG. 3A is an equivalent circuit schematic according to the first embodiment. The MMIC chip 2 is formed on the substrate, and the transmission line 81 and the dielectric resonator 1 are disposed on another substrate, for example a dielectric substrate (a top dielectric layer 17a) made of alumina. The transmission line 81 and the dielectric resonator 1 constitute a resonator circuit comprising parallely-connected LCs.

The permittivity $\epsilon_2$ of the dielectric substrate 17a is considerably smaller than the permittivity $\epsilon_1$ of a semiconductor material such as GaAs, Si, or the like constituting the MMIC chip 2. To take an instance, the permittivity $\epsilon_2$ is about a quarter or less of the permittivity $\epsilon_1$. Further, as shown in FIG. 3B, the coupling constant K of an electromagnetic field is linked to the permittivity $\epsilon$. Consequently, the coupling constant $K_2$ between the transmission line and the dielectric resonator on the dielectric substrate according to the present embodiment is considerably higher than the coupling constant $K_1$ between the transmission line and the dielectric resonator on the MMIC chip 2 shown in FIG. 2 and high performance can be exhibited as an oscillator.

Second Embodiment

A dielectric resonator oscillator (DRO) 100 according to the first embodiment is used as a signal source of a radar module, a radar system, or a communication system using a microwave or a millimeter wave.

Figure 4:
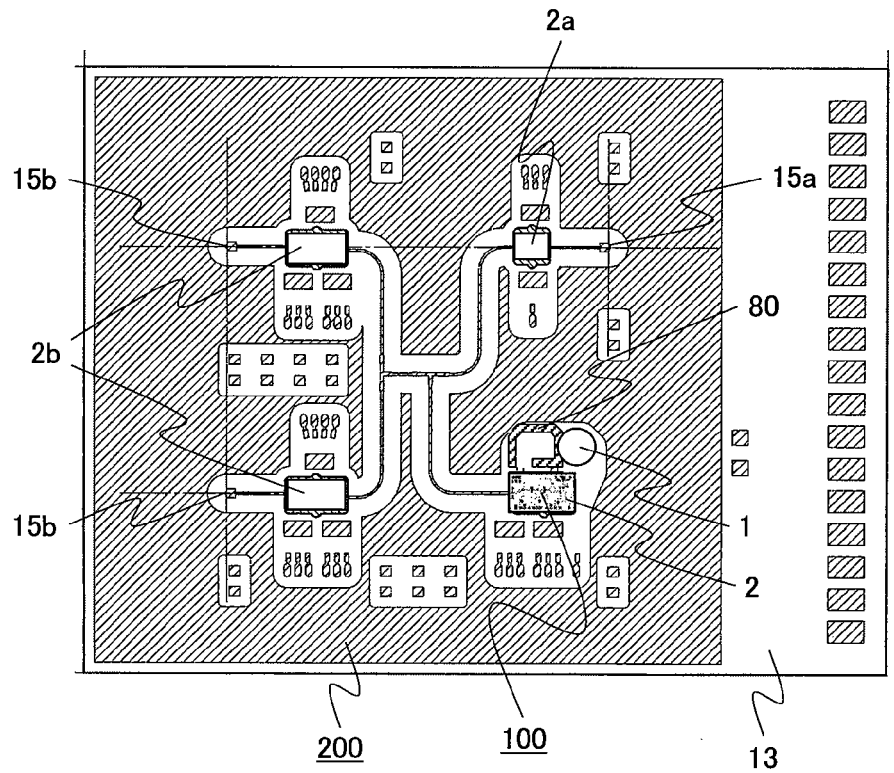
FIG. 4 is a top view showing a transmitting and receiving module substrate according to a second embodiment of the present invention.
Figure 5:
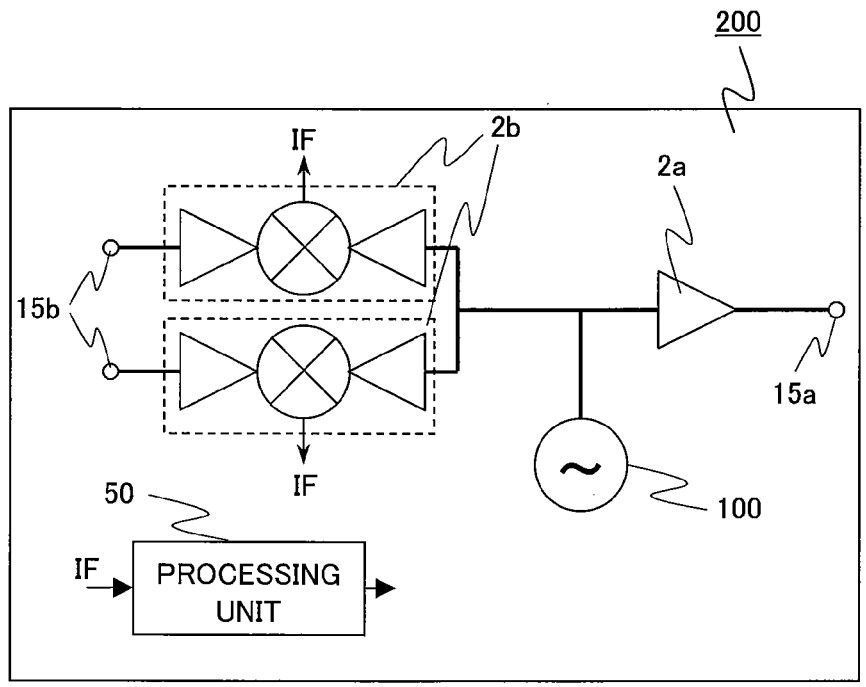
FIG. 5 is an equivalent circuit schematic of a transmitting and receiving module according to the second embodiment of the present invention.

As the second embodiment according to the present invention, an example of a configuration of the case where the DRO 100 according to the first embodiment is applied to a radar system using a microwave or a millimeter wave is shown. FIG. 4 is a top view showing a transmitting and receiving module substrate comprising a transmitting and receiving module and a transmitting and receiving antenna and FIG. 5 is a circuit block diagram thereof.

As a transmitting and receiving module 200 for a radar system, a power amplifier MMIC 2a to amplify transmitting signals and two units of receivers MMICs 2b to mix receiving signals with local signals and generate IF signals are mounted on the multilayered dielectric substrate 13 as a shared ceramic substrate in addition to the DRO 100 having the configuration shown in FIG. 1 and comprising the MMIC chip 2, the transmission line 81, and the dielectric resonator 1. The power amplifier MMIC 2a is connected to a transmitting signal terminal 15a and the receivers MMICs 2b are connected to receiving signal terminals 15b, respectively. Then the transmitting signal terminal 15a and the receiving signal terminals 15b are connected to the feeding points of a transmitting antenna and receiving antennas (those are not shown in the figures), respectively. The MMICs 2a and 2b are connected to each other with a line formed with a top conductive layer 80 on the multilayered dielectric substrate 13 in the same way as the block circuit diagram shown in FIG. 5. Here, the shaded area in FIG. 4 represents a conductor pattern. Wires to feed power to the MMICs 2a and 2b are formed with an inner conductive layer 16 though they are not shown in FIG. 4.

The oscillation condition is settled by electromagnetically coupling the dielectric resonator 1 to the transmission line 81 at a desired resonance frequency that is unambiguously determined by the base area and the height of the dielectric resonator 1, and the oscillation operation is activated. Oscillation signals are amplified by an amplifying means of the MMIC chip 2 and extracted as output signals. The extracted high-frequency signals are divided into two parts with a first power divider and one part is sent to a transmitting antenna from a terminal 15a via the power amplifier MMIC 2a as a power amplifier. The other part is further divided into two parts with a second power divider and input into the local signal terminals of the two sets of the receivers MMICs 2b.

High-frequency signals sent from the transmitting antenna undergo Doppler shift in accordance with reflection from a target and are received with the receiving antenna. The received signals are mixed with local signals in the two units of the receivers MMICs 2b and intermediate frequency (IF) signals are produced. By processing the intermediate frequency (IF) signals at an arithmetic processing unit 50, it is possible to detect a relative speed and a distance from the target located in front of the radar system. By installing two receiving antennas, it is possible to detect an angle in one-dimensional direction of the target from the phase difference of the signals received with both the antennas.

In the components of the transmitting and receiving module according to the present invention, the components formed on the dielectric substrate 13 are only the transmission line 81 and the strip-shaped top conductive layer 80 constituting the open stub 82, and thus it is not necessary to form parts such as the terminating resistor and the earthing means unlike a conventional case. As a result, the effect of suppressing the production cost can be obtained. Further, since the transmission line is electromagnetically coupled to the dielectric resonator on the dielectric substrate having a lower relative permittivity than the MMIC, the coupling of them is never weakened and the effect of preventing the performance of the oscillator from deteriorating is obtained unlike a conventional case. Furthermore, since the oscillating frequency of the DRO can be regulated by adjusting the length of the open stub disposed in the middle of the transmission line, it is not necessary to adjust the position of the dielectric resonator and the assembly time in mass production can be considerably cut.

Here, it goes without saying that other embodiments according to the present invention that will be described below are also applicable to a radar system using a microwave or a millimeter wave of the present embodiment.

Third Embodiment

Figure 6:
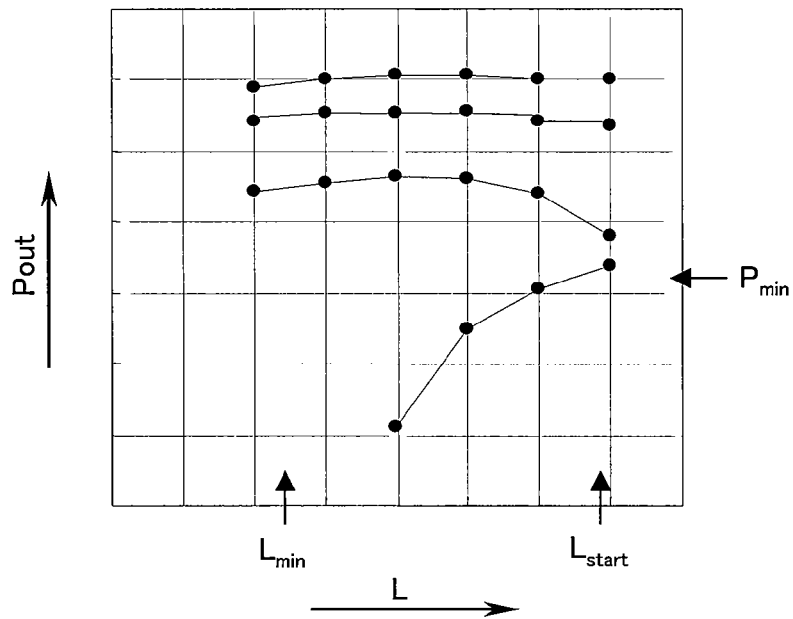
FIG. 6 is a graph explaining the correlation between an open stub length L and an oscillating output power in consideration of the difference between individual dielectric resonator oscillators according to a third embodiment of the present invention.
Figure 7:
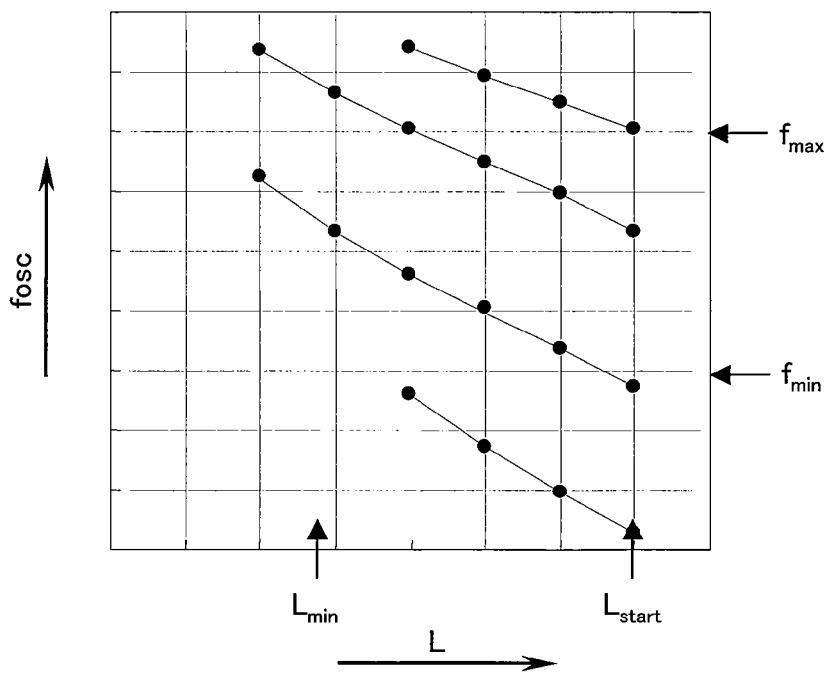
FIG. 7 is a graph showing the correlation between an open stub length L and an oscillating frequency in consideration of the difference between individual dielectric resonator oscillators according to the third embodiment of the present invention.
Figure 8:
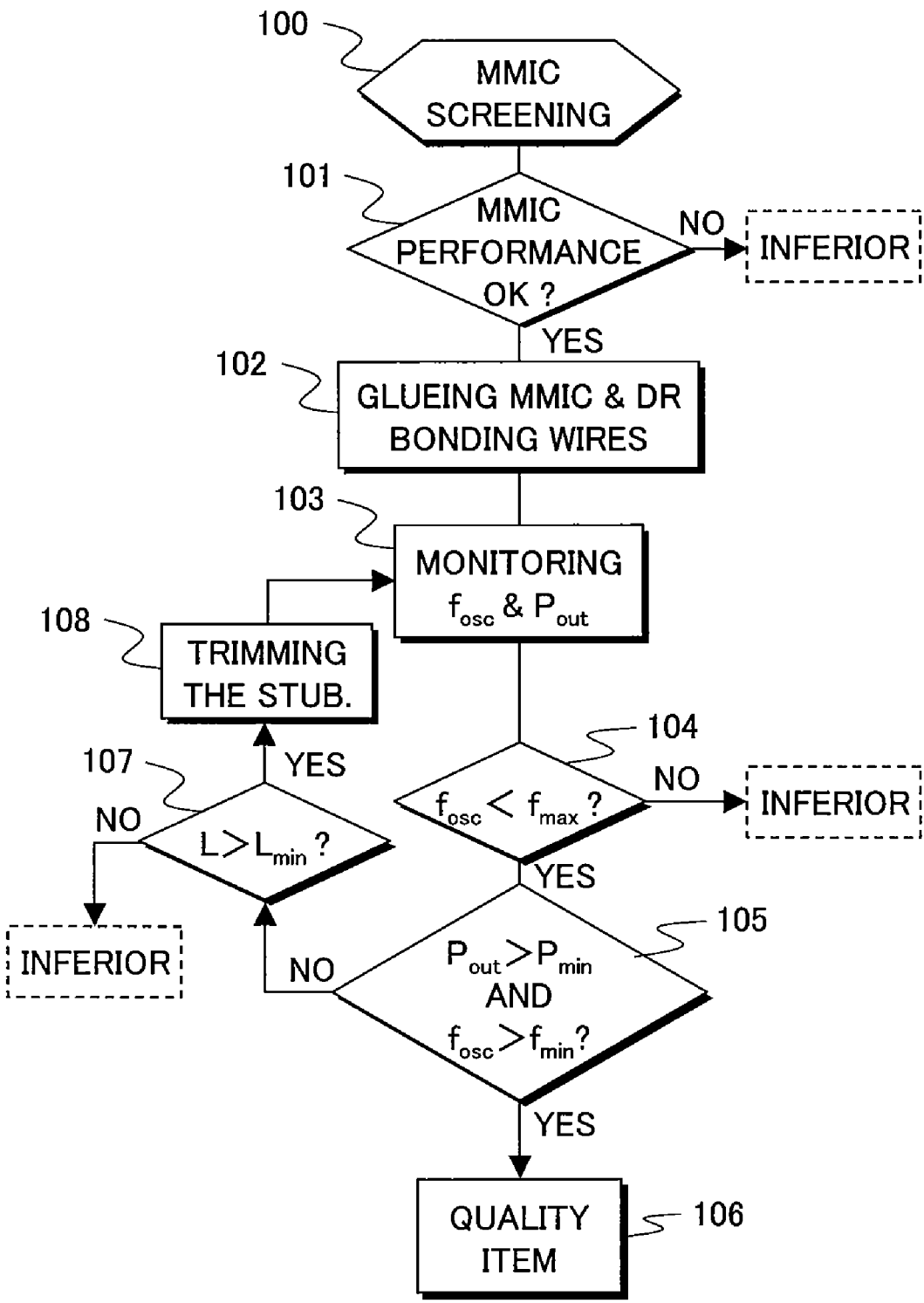
FIG. 8 shows a flow for the production of a dielectric resonator oscillator according to the third embodiment of the present invention.

Successively, as the third embodiment of the present invention, an example of concrete procedure in the case where the DROs 100 according to the first embodiment are produced in quantities is explained in reference to FIGS. 6 to 8. FIG. 6 is a graph showing the correlation between an open stub length L and an oscillating output power $P_{out}$ in consideration of the difference between individual DROs and FIG. 7 is a graph similarly showing the correlation between an open stub length L and an oscillating frequency $f_{osc}$. Further, FIG. 8 shows an assembly flow at the mass production of DROs.

The correlations of the oscillating output power $P_{out}$ and the oscillating frequency $f_{osc}$ with the open stub length L vary in ranges in accordance with individual DROs as shown in FIGS. 6 and 7, reflecting the difference in the positions of dielectric resonators, the difference in the characteristics of MMICs, the difference in the length of wires, and others among the components of the DROs. Here, when the length of the open stub before the start of assembly is expressed with $L_{start}$ and is shortened gradually, the oscillating frequency $f_{osc}$ increases gradually in proportion to the open stub length L as shown in FIG. 7. In contrast, as shown in FIG. 6, there exist a DRO wherein the oscillating output power $P_{out}$ does not change largely in response to the change of the open stub length L and another DRO wherein the oscillating output power $P_{out}$ changes largely in response to the change of the open stub length L.

Here, in FIGS. 6 and 7, the lowest oscillating output power of a mass-produced DRO is represented by $P_{min}$, the lowest oscillating frequency by $f_{min}$, and the highest oscillating frequency by $f_{max}$. Further, the shortest length of the open stub length L beyond which the operation is terminated is represented by $L_{min}$. In the present embodiment, a DRO is assembled in accordance with the procedure shown in the following figure on the basis of the relationship among the open stub length L, the oscillating frequency $f_{osc}$, and the oscillating output power $P_{out}$.

As shown in FIG. 8, firstly stand-alone MMIC chips 2 are sorted (100), only a good MMIC chip 2 is bonded to a multilayered dielectric substrate 13 (101), the MMIC chip 2 is connected to a transmission line 81 with wires, and further a dielectric resonator 1 is bonded (102). Then the oscillating output power $P_{out}$ and the oscillating frequency $f_{osc}$ of the assembled DRO are monitored with a high-frequency probe station (103). Firstly, it is confirmed that the oscillating frequency $f_{osc}$ is lower than the highest oscillating frequency $f_{max}$ (104). Here, when the oscillating frequency $f_{osc}$ is higher than the highest oscillating frequency $f_{max}$, since it is impossible to lower the oscillating frequency $f_{osc}$ lower than the highest oscillating frequency $f_{max}$ by cutting the open stub, the DRO is judged as inferior at the moment and the operation is terminated.

When the oscillating frequency $f_{osc}$ is lower than the highest oscillating frequency $f_{max}$, successively whether or not the oscillating output power $P_{out}$ is larger than the lowest oscillating output power $P_{min}$ and the oscillating frequency $f_{osc}$ is higher than the lowest oscillating frequency $f_{min}$ is confirmed (105). When the above conditions are satisfied, both the oscillating output power $P_{out}$ and the oscillating frequency $f_{osc}$ of the DRO fulfill the conditions as a good product and hence the assembly work of the DRO having good quality is terminated (106).

When the above conditions are not satisfied, the open stub is cut. Firstly, whether or not the open stub length L is larger than $L_{min}$ is confirmed (107). When the answer is no, the DRO is judged as an inferior product and the operation is terminated. When the answer is yes, the open stub is cut by a predetermined length (108). Then the oscillating output power $P_{out}$ and the oscillating frequency $f_{osc}$ are monitored again (103), whether or not both the values have changed to values satisfying the respective conditions of a good product is confirmed and the operation is continued until the product is judged as a good product or an inferior product.

In the preset embodiment, since the oscillating frequency of a DRO can be regulated by adjusting the length of an open stub disposed in the middle of a transmission line, it is not necessary to adjust the position of a dielectric resonator and the assembly time in mass production can be considerably cut.

Fourth Embodiment

Figure 9:
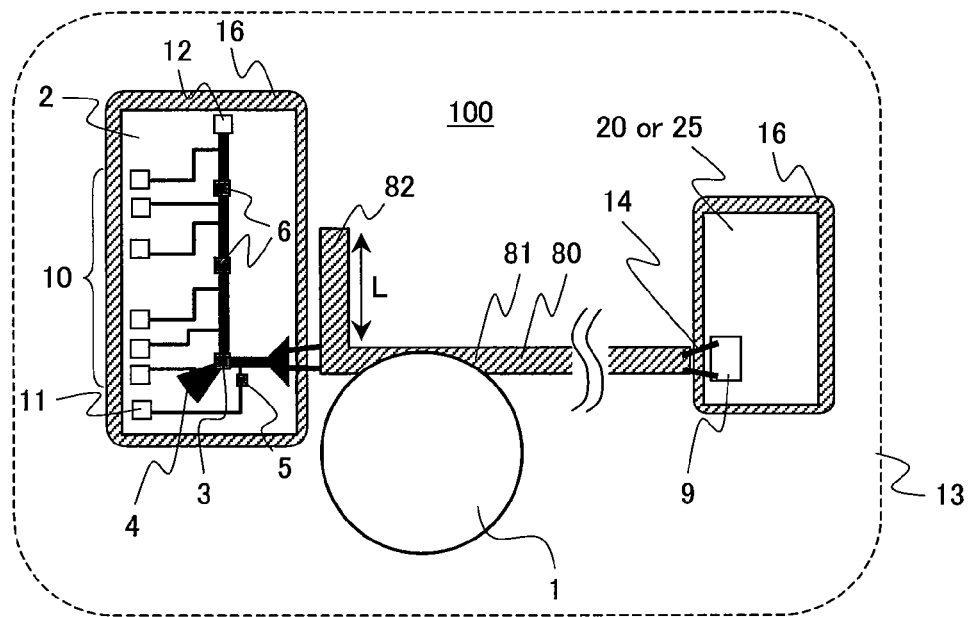
FIG. 9 is a top view showing a dielectric resonator oscillator according to a fourth embodiment of the present invention.

Successively, another embodiment according to the present invention is explained in reference to drawings. FIG. 9 is a top view showing the fourth embodiment according to the present invention. Although a transmission line 81 formed on a multilayered dielectric substrate 13 has been connected to a terminating resistor and the earthing means 9 formed on an MMIC chip 2 operating as an oscillator with wires 14 in the first embodiment, the earthing means 9 may not necessarily be formed on the MMIC chip 2. FIG. 9 is an example wherein an end of the transmission line 81 is connected to another MMIC chip 20 bonded on the multilayered substrate 13 on which the dielectric resonator 1 is disposed, or a terminating resistor and the earthing means 9 formed on a monolayer dielectric substrate 25 with wires 14. The characteristics of the DRO scarcely vary in accordance with the length and the shape of the transmission line 81 on the side close to the terminating resistor when it is viewed from the dielectric resonator 1 and hence it is not particularly necessary to set regulations.

In the present embodiment too, since a transmission line on a dielectric substrate having a low relative permittivity is electromagnetically coupled to a dielectric resonator, the effect of preventing the performance of an oscillator from deteriorating can be obtained. Further, since the oscillating frequency of a DRO can be regulated by adjusting the length of an open stub disposed in the middle of a transmission line, it is not necessary to adjust the position of a dielectric resonator and the effect of considerably reducing the assembly time in mass production can be obtained.

Fifth Embodiment

Figure 10:
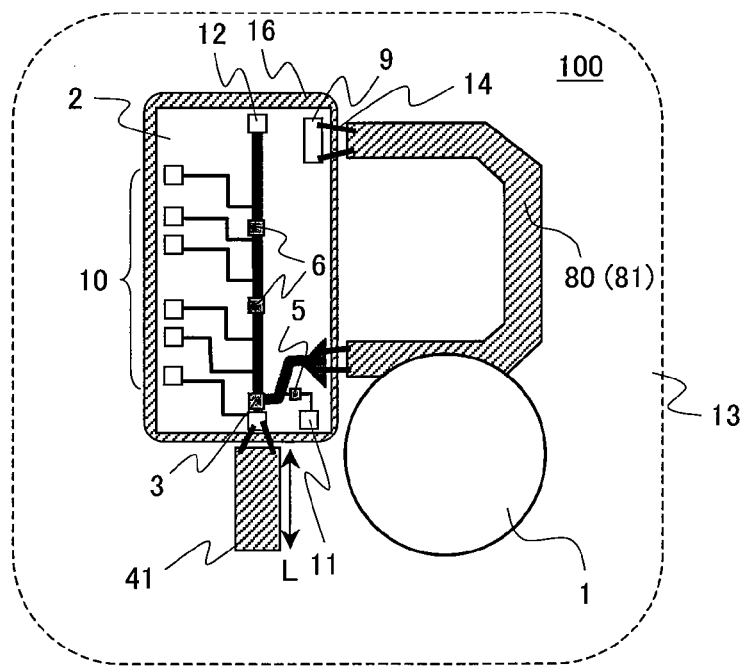
FIG. 10 is a top view showing a dielectric resonator oscillator according to a fifth embodiment of the present invention.
Figure 11:
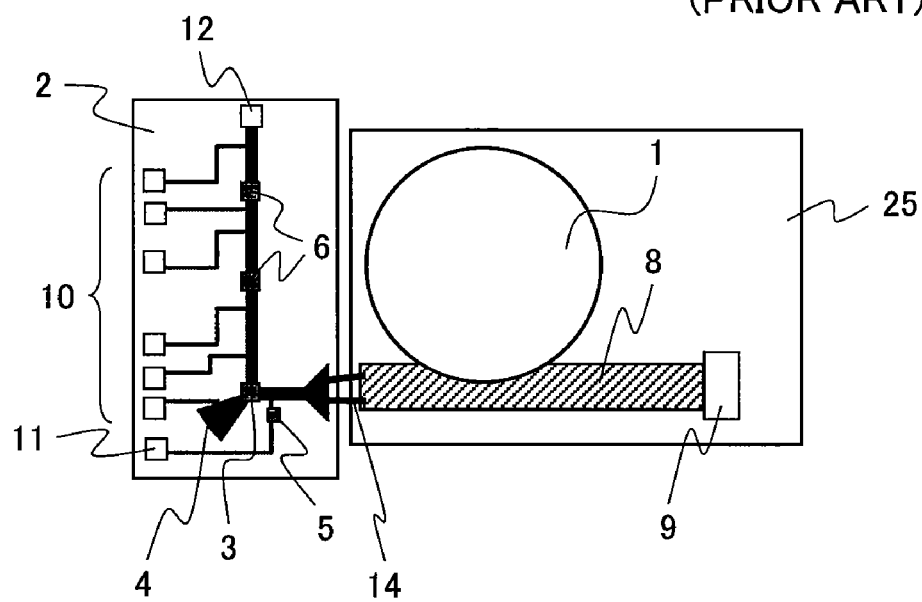
FIG. 11 is a top view showing the first example of a conventional dielectric resonator oscillator.
Figure 12:
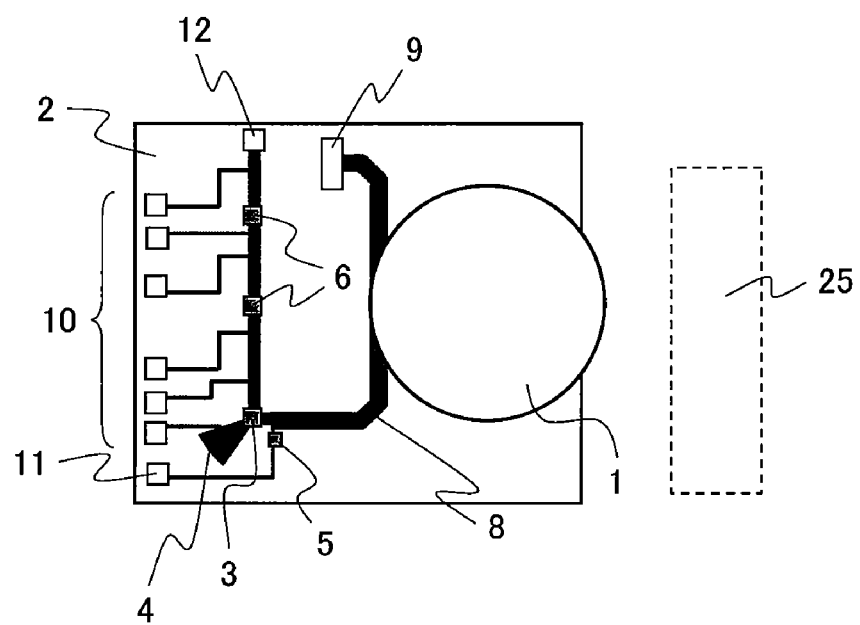
FIG. 12 is a top view showing the second example of a conventional dielectric resonator oscillator.

In FIG. 10, an open stub to adjust the characteristics of a DRO is not formed on a top conductive layer 80 and, in place of the open stub, a negative resistance producing element 41 connected to an oscillating active element 3 with wires is formed on a multilayered dielectric substrate 13 on which a dielectric resonator 1 is disposed. The oscillating frequency of the dielectric resonator 1 is regulated by adjusting the length L of the negative resistance producing element 41 as a member for oscillating frequency regulation. In the configuration too, the oscillating frequency increases by shortening the length L of the negative resistance producing element 41 and hence the effect of considerably reducing the assembly time in the mass production of DROs can be obtained in all the same way as the first embodiment.

What is claimed is:
1. A dielectric resonator oscillator comprising:
an MMIC;
a transmission line; and
a dielectric resonator disposed on a dielectric substrate,
wherein the MMIC comprises
an oscillating circuit;
a frequency regulation circuit; and
a power supply circuit,
wherein an active element on the MMIC is connected to the transmission line with metallic wires or metallic ribbons,
wherein the dielectric resonator is electromagnetically coupled to the transmission line,
wherein the dielectric resonator oscillator further comprises a member for oscillating frequency regulation formed on the dielectric substrate,
wherein the member for oscillating frequency regulation comprises an open stub formed in the middle of the transmission line on the dielectric substrate on a side near to the active element when viewed from the dielectric resonator,
wherein an oscillating frequency of the dielectric resonator oscillator is regulated by a length of the open stub, and
wherein the open stub disposed in the transmission line on the dielectric substrate is formed opposite the dielectric resonator with the transmission line interposed therebetween.

2. The dielectric resonator oscillator according to claim 1, wherein a terminating resistor and earthing means are formed on the MMIC, and
wherein an end of the transmission line is connected to the terminating resistor with metallic wires or metallic ribbons.

3. The dielectric resonator oscillator according to claim 1, wherein a terminating resistor and earthing means are formed on a second MMIC other than the MMIC on the dielectric substrate or on a second dielectric substrate, and
wherein an end of the transmission line on the dielectric substrate is connected to the terminating resistor with metallic wires or metallic ribbons.

4. The dielectric resonator oscillator according to claim 1, wherein the open stub is shaped so that a tip thereof opens toward the MMIC chip.

5. The dielectric resonator oscillator according to claim 1, wherein the dielectric resonator oscillator comprises a negative resistance producing element that is formed on the dielectric substrate and connected to an oscillating active element on the MMIC with metallic wires or metallic ribbons, as the member for oscillating frequency regulation.

6. The dielectric resonator oscillator according to claim 1, wherein the chip of the MMIC constituting the dielectric resonator is incorporated into a hole pierced in a dielectric layer that is the uppermost layer in a multilayer-structured dielectric substrate and bonded and fixed to an inner conductive layer of the multilayer-structured dielectric substrate, and
wherein the transmission line formed with a top conductive layer in the multilayer-structured dielectric substrate is connected to the surface of the chip of the MMIC with the metallic wires or the metallic ribbons on a substantially identical plane.

7. A dielectric resonator oscillator comprising:
a transmission line formed on a dielectric substrate; and
an MMIC and a dielectric resonator disposed on the dielectric substrate,
wherein the MMIC comprises
an oscillating circuit;
a frequency regulation circuit; and
a power supply circuit,
wherein an active element on the MMIC is connected to the transmission line with metallic wires or metallic ribbons, wherein a permittivity of the dielectric substrate is smaller than a permittivity of the MMIC, wherein the dielectric resonator is electromagnetically coupled to the transmission line by being disposed on the dielectric substrate in the vicinity of the transmission line or in the state of overlapping with the transmission line, wherein a member for oscillating frequency regulation comprises an open stub formed in the middle of the transmission line on the dielectric substrate on a side near to the active element when viewed from the dielectric resonator, wherein an oscillating frequency of the dielectric resonator oscillator is regulated by a length of the open stub, and wherein the open stub disposed in the transmission line on the dielectric substrate is formed opposite the dielectric resonator with the transmission line interposed therebetween.

8. The dielectric resonator oscillator according to claim 7, wherein the permittivity of the dielectric substrate is smaller than a quarter of the permittivity of the MMIC.

9. The dielectric resonator oscillator according to claim 7, wherein the material of the dielectric substrate is alumina.

10. The dielectric resonator oscillator according to claim 7, wherein a terminating resistor and earthing means are formed on the MMIC, and wherein an end of the transmission line is connected to the terminating resistor with metallic wires or metallic ribbons.

11. The dielectric resonator oscillator according to claim 7, wherein the dielectric resonator oscillator comprises a negative resistance producing element for oscillating frequency regulation that is formed on the dielectric substrate and connected to an oscillating active element on the MMIC with metallic wires or metallic ribbons.

12. The dielectric resonator oscillator according to claim 7, wherein the chip of the MMIC constituting the dielectric resonator is incorporated into a hole pierced in a dielectric layer that is the uppermost layer in a multilayer-structured dielectric substrate and bonded and fixed to an inner conductive layer in the multilayer-structured dielectric substrate, and wherein the transmission line formed with a top conductive layer in the multilayer-structured dielectric substrate is connected to the surface of the chip of the MMIC with the metallic wires or the metallic ribbons on a substantially identical plane.

13. A radar system comprising:
a transmitting and receiving module; and
a transmitting and receiving antenna,
wherein the transmitting and receiving module comprises a dielectric resonator oscillator used as a signal source,
wherein the dielectric resonator oscillator comprises
an MMIC;
a transmission line; and
a dielectric resonator formed on a dielectric substrate,
wherein the MMIC of the dielectric resonator oscillator comprises
an oscillating circuit;
a frequency regulation circuit; and
a power supply circuit,
wherein an active element on the MMIC is connected to the transmission line with metallic wires or metallic ribbons, wherein a permittivity of the dielectric substrate is smaller than a permittivity of the MMIC of the dielectric resonator oscillator, wherein the dielectric resonator is electromagnetically coupled to the transmission line by being disposed on the dielectric substrate in the vicinity of the transmission line or in the state of overlapping with the transmission line, wherein the dielectric resonator oscillator comprises a member for oscillating frequency regulation formed on the dielectric substrate, wherein a terminating resistor and an earthing means are formed on the MMIC of the dielectric resonator oscillator, wherein an end of the transmission line is connected to the terminating resistor with metallic wires or metallic ribbons, wherein a member for oscillating frequency regulation comprises an open stub formed in the middle of the transmission line on the dielectric substrate on a side near to the active element when viewed from the dielectric resonator, wherein an oscillating frequency of the dielectric resonator oscillator is regulated by a length of the open stub, and wherein the open stub disposed in the transmission line on the dielectric substrate is formed opposite the dielectric resonator with the transmission line interposed therebetween.

14. The radar system according to claim 13,
wherein the dielectric substrate is made of LTCC, and
wherein the transmitting and receiving module comprises the dielectric resonator oscillator; a power amplifier MMIC to amplify transmitting signals; and two units of receivers MMICs to generate IF signals by mixing receiving signals with local signals.

15. The radar system according to claim 14,
wherein the open stub disposed in the transmission line on the dielectric substrate is shaped so that a tip thereof opens toward the MMIC chip of the dielectric resonator oscillator.

16. The radar system according to claim 13,
wherein the chip of the MMIC constituting the dielectric resonator is incorporated into a hole pierced in a dielectric layer that is the uppermost layer in a multilayer-structured dielectric substrate and bonded and fixed to an inner conductive layer in the multilayer-structured dielectric substrate, and wherein the transmission line formed with a top conductive layer in the multilayer-structured dielectric substrate is connected to the surface of the chip of the MMIC with the metallic wires or the metallic ribbons on a substantially identical plane.

* * * * *